(12) United States Patent
Mathur et al.

(10) Patent No.: US 10,861,508 B1
(45) Date of Patent: Dec. 8, 2020

(54) TRANSMITTING DBI OVER STROBE IN NONVOLATILE MEMORY

(71) Applicant: SanDisk Technologies LLC, Addison, TX (US)

(72) Inventors: Shiv Mathur, Karnataka (IN); Nitin Gupta, Karnataka (IN); Ramakrishnan Subramanian, Karnataka (IN)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/679,528

(22) Filed: Nov. 11, 2019

(51) Int. Cl.
*G11C 7/22* (2006.01)
*G11C 7/10* (2006.01)
*G06F 9/30* (2018.01)
*G11C 11/4096* (2006.01)

(52) U.S. Cl.
CPC ........ *G11C 7/1048* (2013.01); *G06F 9/30156* (2013.01); *G11C 7/222* (2013.01); *G11C 11/4096* (2013.01)

(58) Field of Classification Search
CPC .......... G11C 7/22; G11C 8/18; G11C 16/0483
USPC ............................................. 365/193, 230.05
See application file for complete search history.

(56) References Cited

U.S. PATENT DOCUMENTS

| | | | |
|---|---|---|---|
| 6,046,943 A | 4/2000 | Walker | |
| 6,934,796 B1* | 8/2005 | Pereira | G11C 15/00 365/49.17 |
| 7,869,525 B2 | 1/2011 | Macri et al. | |
| 7,936,289 B2 | 5/2011 | Bae et al. | |
| 8,260,992 B2 | 9/2012 | Dearth et al. | |
| 9,384,822 B2 | 7/2016 | Shu et al. | |
| 9,529,749 B2 | 12/2016 | Hollis | |
| 2006/0117155 A1* | 6/2006 | Ware | G11C 8/06 711/163 |
| 2007/0217559 A1* | 9/2007 | Stott | G11C 7/222 375/355 |
| 2009/0009510 A1* | 1/2009 | Shu | G09G 3/3688 345/215 |
| 2009/0122856 A1* | 5/2009 | Baxter | G11C 5/066 375/239 |
| 2009/0300237 A1* | 12/2009 | Nobunaga | G11C 7/10 710/61 |
| 2011/0242145 A1* | 10/2011 | Nishimura | H03F 3/45233 345/690 |
| 2012/0011298 A1* | 1/2012 | Lee | G06F 13/1668 711/102 |
| 2015/0286405 A1* | 10/2015 | Chang | G11C 16/00 711/103 |
| 2016/0196789 A1* | 7/2016 | Suyama | G09G 3/3688 345/209 |
| 2017/0170845 A1* | 6/2017 | Cho | H03M 13/09 |
| 2017/0365335 A1* | 12/2017 | Wang | G11C 16/0483 |
| 2018/0090190 A1* | 3/2018 | Hong | G11C 7/10 |
| 2018/0210653 A1* | 7/2018 | Parthasarathy | G06F 12/0246 |

(Continued)

*Primary Examiner* — Michael T Tran
(74) *Attorney, Agent, or Firm* — Dickinson Wright PLLC; Steven Hurles

(57) ABSTRACT

A methodology and structure for a encoding a data stat signal in the data lock signal, e.g., the data strobe signal such as DBQ. The data strobe signal can maintain the clock continuity, e.g., the rise and fall edges are at the timing signal, and the data inversion can be based on the amplitude of the data strobe signal. This allows the data set on the data lines, e.g., D0-D7, to either be non-inverted or inverted, to save power consumed in the memory device.

20 Claims, 9 Drawing Sheets

(56) References Cited

U.S. PATENT DOCUMENTS

| | | | |
|---|---|---|---|
| 2018/0322914 A1* | 11/2018 | Wu | G06F 13/4086 |
| 2018/0357188 A1 | 12/2018 | Brief | |
| 2019/0042498 A1* | 2/2019 | Morris | G06F 12/0215 |
| 2019/0079672 A1* | 3/2019 | Kim | G06F 3/0655 |
| 2019/0221271 A1* | 7/2019 | Sudo | G11C 7/02 |
| 2019/0340995 A1* | 11/2019 | Miyata | G09G 3/36 |

* cited by examiner

TRANSMITTING DBI OVER STROBE IN NONVOLATILE MEMORY

TECHNICAL FIELD

This disclosure relates to memory systems and methods, and in particular, to memory methods and systems with transmitting data inversion in the strobe signal.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

SUMMARY

This disclosure relates generally to memory systems and methods that encode an inversion indication in the clock signal. The clock signal can maintain clock continuity and indicate the inversion state of the accompanying data on the data bus. The clock signal can include at least two distinct amplitudes to indicate that the data is inverted or not inverted. In an example embodiment, the data is on the data lines, D0-D7, and the clock is on the clock line(s).

An aspect of the disclosed embodiments of the present disclosure include a non-volatile memory, e.g., a NAND memory, that encodes the data strobe signal and the data invert signal together.

In an aspect of the present disclosure, the present disclosure includes encoding data bits in a data set to be transmitted on a data bus in a non-volatile memory device, wherein encoding includes not inverting the data bits based on a first data state and inverting the data bits based on a second data state.

In an aspect of the present disclosure, the present disclosure includes encoding a data strobe signal to include an inversion indicator of a non-inversion state or an inversion state of the data set within the strobe signal.

In an aspect of the present disclosure, the present disclosure includes transmitting the data set.

In an aspect of the present disclosure, the present disclosure includes decoding the data set using the data strobe signal.

In an aspect of the present disclosure, encoding a data strobe signal includes maintaining clock continuity with the inversion indicator while simultaneously transmitting both the data strobe signal and the inversion indictor on a single channel.

In an aspect of the present disclosure, encoding the data strobe signal includes encoding a data strobe positive signal and a data strobe negative signal.

In an aspect of the present disclosure, encoding the data strobe signal includes shifting the common mode voltage level of both the data strobe positive signal and the data strobe negative signal from a base level to set the inversion indicator to indicate that the data set is inverted.

In an aspect of the present disclosure, encoding the data strobe signal includes maintain the differential between the data strobe positive signal and the data strobe negative signal to set the data strobe.

In an aspect of the present disclosure, decoding includes comparing the data strobe positive signal and the data strobe negative signal to each other to recover a clock signal and comparing the data strobe positive signal and the data strobe negative signal to a voltage reference to recover the inversion indicator from the data strobe signal.

In an aspect of the present disclosure, the recovered clock signal controls operation of a dual edge triggered flip-flop to forwarding of the data set and determining the inversion indicator that controls whether to invert the data set.

In an aspect of the present disclosure, a method includes determining whether to invert a data set on a data channel, including considering whether less power will be used if the data bus is inverted, a percentage of data bits or count of the data bits that will change state as compared to respective previous values, and whether a majority of data bits will toggle high-to-low or low-to-high depending on the data pattern. Based on a determination to invert the data set, a data inversion indictor is encoded in the data strobe signal with a data strobe and data inversion indictor being transmitted at the same time on the data strobe channel. The inversion indicator and data strobe is received at an end of the channel.

In an aspect of the present disclosure, the inversion indicator decodes to determine whether the data set is inverted and the strobe signal both from the data strobe channel.

In an aspect of the present disclosure, the received data set is interpreted using the decoded inversion indictor and the decoded data strobe signal.

In an aspect of the present disclosure, determining whether to invert the data bus comprises determining to invert the data set if more than half of a number of data bits in the data set will change state.

In an aspect of the present disclosure, the data channel comprises a terminated-high bus, and wherein determining whether to invert the data set received at a terminal end of the terminated-high bus comprises determining whether more than half of the number of data bits in the data set will change state from a high logic state to a low logic state.

In an aspect of the present disclosure, the data channel comprises a terminated-low bus, and wherein determining whether to invert the data set received at a terminal end of the terminated-low bus comprises determining whether more than half of a number of data bits in the data set will change state from a low logic state to a high logic state.

In an aspect of the present disclosure, the data channel comprises a center tapped bus. The determining procedure operates to determine whether to invert the data set received at a center tap of the bus includes determining whether more than half of a number of data bits in the data set will change state, e.g., from a low logic state to a high logic state or a low logic state to a high logic state. The use of the inversion indicator can be used to reduce a quantity of transitions on the data lines in the bus.

In an aspect of the present disclosure, encoding data inversion indictor in the data strobe signal includes maintaining clock continuity with the data inversion indicator while simultaneously transmitting both the data strobe signal and the data inversion indictor in a data strobe communication.

In an aspect of the present disclosure, non-volatile memory, comprises a transmitter to encode data bits in a data set to be transmitted on a data bus in the NAND memory, wherein encoding includes not inverting the data bits based on a first data state and inverting the data bits based on a second data state.

In an aspect of the present disclosure, non-volatile memory, comprises a transmitter encode a data strobe signal to include an inversion indicator of a non-inversion state or an inversion state of the data set within the data strobe signal that communicates a clock.

In an aspect of the present disclosure, non-volatile memory, comprises a transmitter to transmit the data set.

In an aspect of the present disclosure, a data bus receives the data set from the transmitter and delivers the data set to a receiver.

In an aspect of the present disclosure, a receiver is configured to receive the data set and the data strobe signal and decode both the clock and the inversion indicator from the data strobe signal.

In an aspect of the present disclosure, the receiver is configured to decode a common mode voltage from a differential data strobe signal to determine the inversion indicator.

In an aspect of the present disclosure, the receiver is configured to determine phase and frequency of the data set from the differential of a data strobe positive signal and a data strobe negative signal.

In an aspect of the present disclosure, the receiver includes a comparator to compare both a data strobe positive signal and a data strobe negative signal to a reference voltage to determine the inversion indicator.

In an aspect of the present disclosure, the receiver sets the inversion indictor to invert the data set when the common mode voltage exceeds the reference voltage.

In an aspect of the present disclosure, the reference voltage is greater than 0.6*VDDO.

In an aspect of the present disclosure, the receiver includes a comparator to determine the clock and a plurality of dual-edge triggered flip flops to capture the data set and the inversion indicator, and an inversion circuit to invert the data set when the inversion indicator indicates that the data set is inverted.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

The present disclosure describes embodiments that provide for inversion of data sets on the communication channels without using an additional communication channel for indicating the inversion status of data set. The inversion status can be indicated with the data, e.g., the inversion status is synchronously communicated with the data set. If an additional communication channel is used, it would require additional power and additional area on the die. In some chip designs it is not possible to add another high speed communication line, e.g., due to package size or other product limitations. The use of additional power and additional area on the die are both undesirable and should be avoided. The inversion indicator can be encoded into the data strobe signal or the clock signal. Both the inversion indicator and the data strobe are communicated at the same time to the receiving end of data channel.

Figure 1:
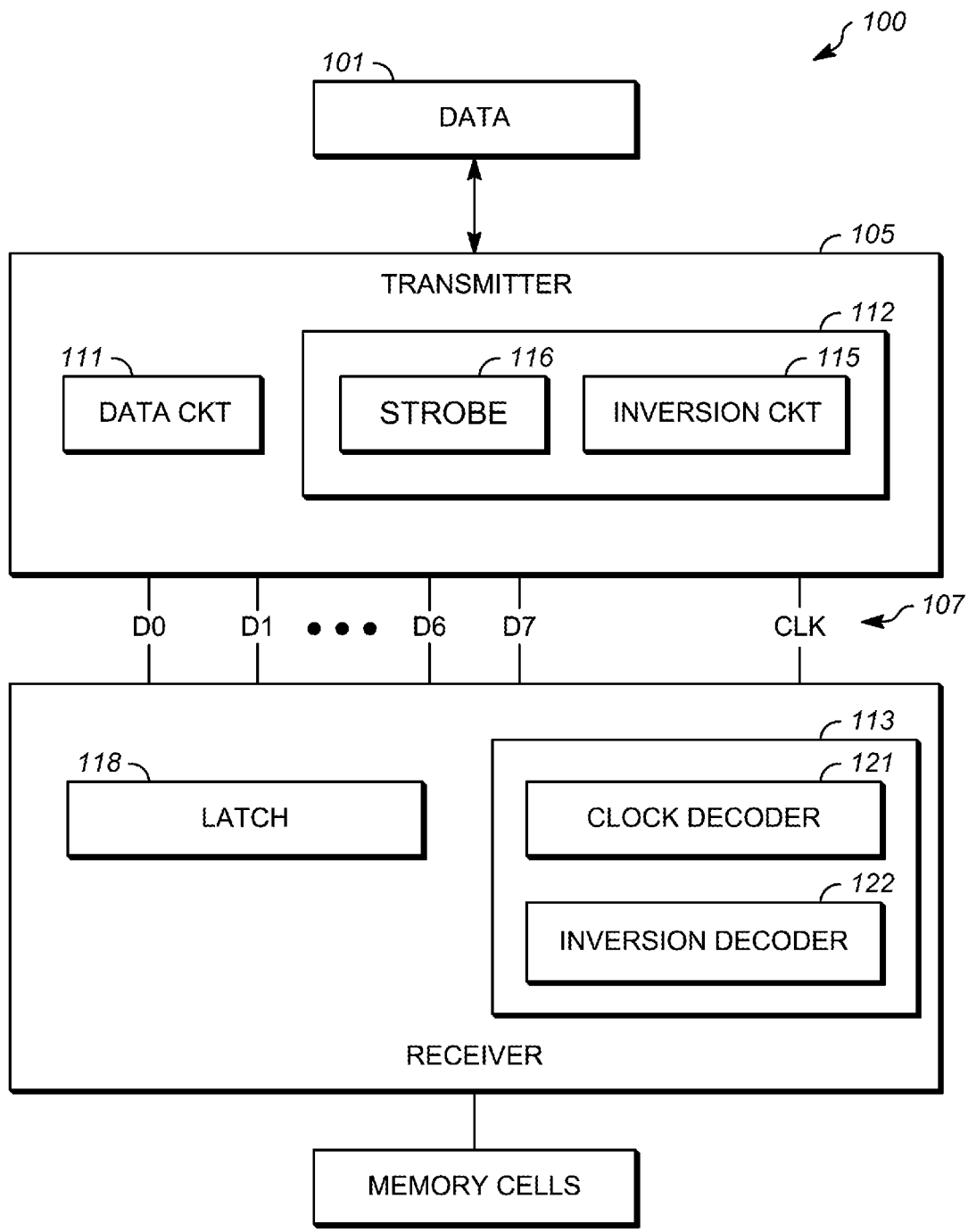
FIG. 1 shows a system using data inversion signaling over the strobe in a nonvolatile memory.

FIG. 1 generally illustrates a portion of a memory system 100 that receives data 101 at a transmitter 105. The transmitter 105 sends the data over communication channels 107 to a receiver 110. The transmitter 105 includes data circuitry 111 to condition the data into a word including multiple bits and drive the data an appropriate signal level (e.g., voltage). The communication channels 107 include a channel for each bit in the data set (e.g., a data word). A channel can be a trace in the integrated circuit to provide electrical communication between integrated circuit elements, either on die or off die. The channel can include one or more of a cable, a PCB trace, or any other known transmission medium. The communication channels can also include a strobe communication channel (CLK) or a two strobe communication channels to provide differential signals to aid in determining the clock at the receiver 110. The strobe communication channel can include the clock signal and phase information within the chip, e.g., memory chip. The strobe communication channel transmits the strobe signal from the strobe circuitry 112 (to the clock decode circuitry 113. The clock signal on the also includes an indication of an inversion status of the data on the data bus, i.e., the data communication lines, e.g., D0-D7 when the word is eight bits. The communication channels can be high speed channels to support multi-bit communication. The data bits are either inverted or not inverted to save the power used in the transfer of the data in the memory system. In an example, the power to decode certain data bits is greater than decoding the other data bits. The power to decode "0" data bits may be greater than the power to decode "1" data bits due to the structure of the receiver 110. Accordingly, a reduction in the density of "0" data bits will conserve power. Data latch circuitry 118 receives the data from the communication lines and receives data voltage signals at an end of the data channels (here, D0-D7). Data latch circuitry can include a flip-flop circuitry to sample the data using the recovered strobe signal. The clock signal circuitry 113 includes a clock decoder 121 and an inversion decoder 122. The receiver 110 detects the clock signal and the inversion indicator from the clock signal CLK. The receiver 110 synchronizes the data at the latch based on decoded clock signal from the clock detection circuitry 121 and the inversion status from the inversion decoder 113. The receiver 110 can invert the data bits at the latch 118 when the inversion decoder 113 indicates that the data at the latch is inverted.

In operation, the system 100 operates to receive the data set and selectively invert the data set, e.g., on a word basis, which can be 2N bits, to reduce power consumption in transmitting and decoding the data at the far end of the data channel. The inversion indicator is encoded into the data strobe signal. The data strobe signal can be based on the clock signal. The inclusion of the inversion indicator does not change the timing of the data strobe signal. The data strobe signal maintains its rising and falling edges. In an example embodiment, the amplitude of the data strobe signal can be at a first level for data inversion and a second level for data that is not inverted. The common-mode voltage can be shifted. The first level can have a higher voltage level than the second level. As the data set and the strobe signal DQ and the data signal are synchronously transferred in the channel 107, the data strobe DQ arrives with the data. The strobe signal DQ contains the frequency and the phase information for the data set. The strobe signal DQ can be encoded as a differential signal, i.e., DQSP and DQSN. The strobe information can be preserved for clock recovery and can be recovered by a differential receiver. In the same signal, the inversion indicator can be encoded by shifting the level of both the data strobe positive (DQSP) and the data strobe negative (DQSN) to indicate inversion while maintaining the clock information in both DQSP, DQSN, both the rising and falling edges. In this example, the differential between both the data strobe positive (DQSP) and the data strobe negative (DQSN) is maintained with the level being a first level for no inversion of the data and at a shifted level, for example, about 0.25 volts higher to indicate inverted data. The voltage level shift could be an amount that can be detected at the far end, e.g., a common-mode voltage shift of greater than 0.2 volts.

Modern high speed interfaces in various memory device, e.g., non-volatile memory, some known problematic phenomena are even more pronounced than in slower interfaces. For example, transfer of data from a controller to the memory or with in the memory transmit many bits at a time, which can experience degradation in data integrity due to excessive rates of current change. Data transmission typically involves multiple-bit bytes or words. A byte can be 8 bits, 12 bits, or 16 bits, for example. If all of the bits change state at the same time the data and power channels draw a relatively large amount of current. Changing state is changing logic voltage level. When there is a lot of current on the bus, it affects the rate of change of current in the bus, or di/dt. When the number of bits changing state on the bus at one time increases, the rate of change of the current (di/dt) increases accordingly. When di/dt increases, the signal integrity becomes a challenge due to large supply noise. At higher frequencies of data communication this phenomenon is exaggerated.

A way to address the increase in current is to reduce di/dt by controlling the number of bits that change state using a Dynamic Data Bus Inversion (DBI) scheme. For example, if there are eight bits on the data channel (each transmitted on a single communication line), and it is determined that five of the eight bits are to be toggled, instead of toggling the five to be toggled, the other three are toggled. The five to be toggled are not toggled. That is, if the majority of bits are scheduled to be toggled, the data on the channel is inverted and the minority of bits is toggled instead. An inversion indictor signal is sent to the receiver indicating the bus is in an inverted state. The receiver then can decode the eight bits correctly when they are received. So if the majority of bits is scheduled to toggle, the data set on the channel is inverted and the minority of bits is toggled instead. This can minimize power consumption. For a terminated data channel, power usage is affected by the way bits on each channel line are toggled. For example, if the bus is terminated high to the power supply, when the data stays low, there will be a direct current path from power to ground, and thus power is consumed. When the data stays high, there is no current, and thus no power is consumed. Therefore, to reduce power, it is better for more data bits to stay high than low for a terminated-high bus. Similarly, for terminated-low bus, it is better for more data bits to stay low than high from a power consumption point of view. DBI can take advantage of this fact. For example, if there are eight bits on a terminated-high bus, and it is determined that five of the eight bits are to stay low, instead of toggling those five bits to be low, the other three bits are toggled to be low. For a terminated-low bus, the high and low bits are reversed. The five to be toggled are not toggled. Again, an inversion indictor signal is sent to the receiver indicating that the data bits on the channel are being inverted. In an example embodiment, the bus can be center tapped. The center taps provide electrical connection to each communication line in the data bus intermediate the two terminal ends. The center tap need not be connected at the exact center but can be close to the half-length of between the two quarter lengths. The receiver then can decode the eight bits correctly when they are received. In an application, an extra channel is provided to communicate the inversion indicator signal to the receiver. That is, an extra bit and pin, e.g., a DBI bit and a DBI pin, are used to indicate to the receiver whether or not the data on the channel is inverted. When this is used, one DBI channel required for each data byte. In a 64-bit interface, an additional eight DBI channels are required just for the DBI function. In an example embodiment and as described herein, the data inversion indictor can be encoded into the data strobe signal such that an extra pin and communication channel are not required. In the example of the center tap, the change in the data on the data bus can be used to reduce the quantity of inversions of the data on the communication lines.

Figure 2:
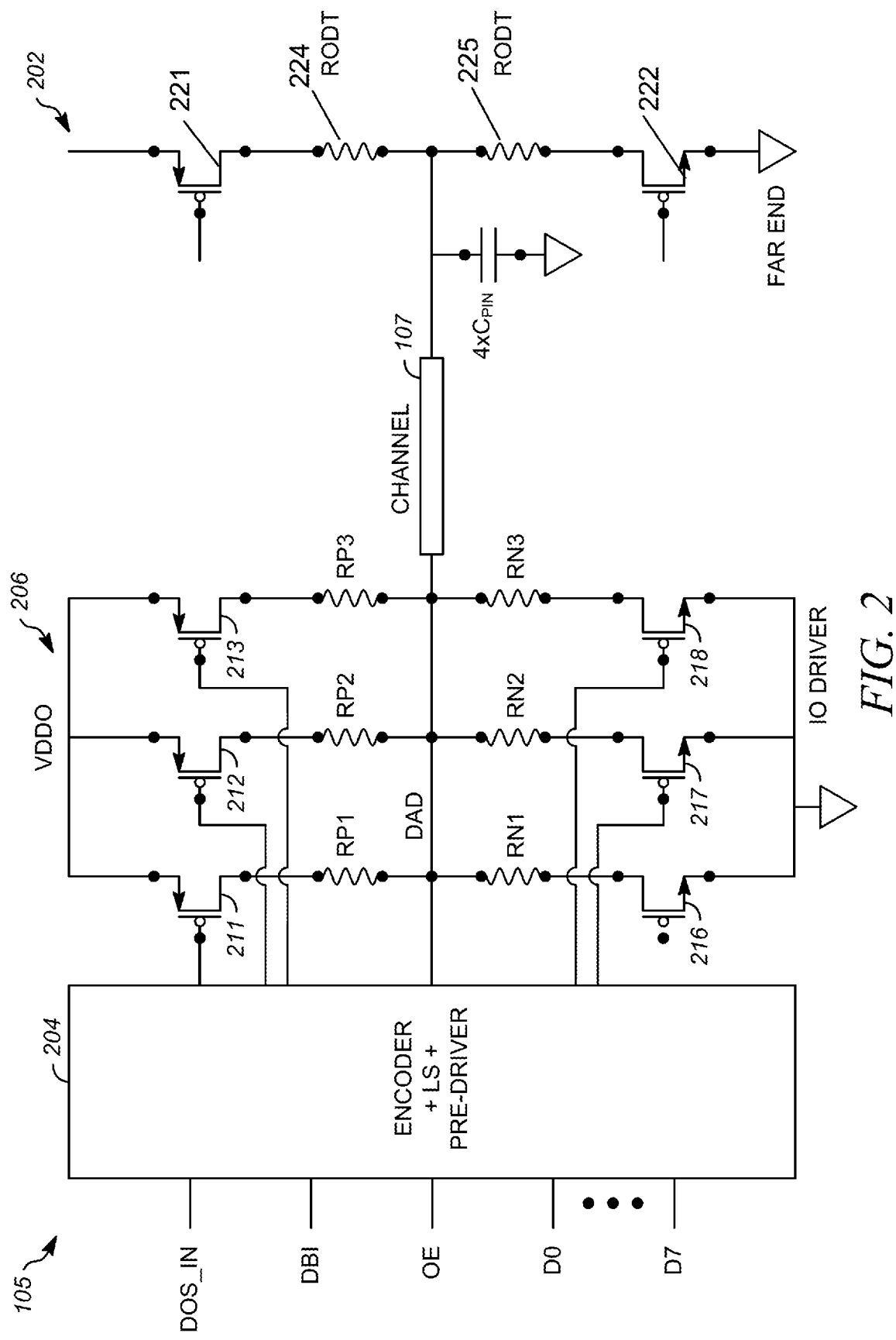
FIG. 2 shows a transmitter to send data over a bus including data inversion signaling over the strobe according to an aspect of the present disclosure.

FIG. 2 illustrates an example embodiment of the transmitter 105 connected to a channel 107 and signal pullup circuitry 202 at the far end of the channel 107. Driver circuitry 204 receives the data signals D0-D7 and control signals from a controller. The control signals can include a data strobe input DQS_IN, a data bus inversion signal DBI, and output enable signal OE and the data signals D0-D7. The driver circuitry 204 operates to synchronize the data and the control signals output on the channel 107. The channel 107 can have two differential data strobe signals and data channels D0-D7. The circuitry 204 operates to encode the data inversion signal and the data D0-D7. In operation, the data inversion can be performed according to any of the teachings herein. If the data set is inverted, then the circuitry 204 sets the data inversion indicator and integrates that signal into the differential data strobe signal. The encoding operation changes the common mode voltage of both the differential signals comprising the data strobe signal to indicate that the data is inverted.

An I/O driver 206 receives output signals from the encoder circuitry 204 and outputs signals to the channel 107. The I/O driver includes more than one pull-up transistors 211-213 that can pull the terminal pad at the start of the channel up to a supply voltage, e.g., VDDO, a positive voltage. The I/O driver includes more than one pull-down transistors 216-218 that can pull the terminal pad at the start of the channel down to low voltage, e.g., ground or a negative voltage. In operation when driving the pad to a high state all of the top transistors 211-213 can be on (conducting) based on a signal from the encoding circuitry 204 to pull the pad up quickly with all of the bottom transistors 216-218 being off. When the high level is reached, then two of the top transistors 212, 213 can turn off. This can be the "1" state. At a neutral state, e.g., zero volts, all of the transistors 211-213, 216-218 are off. When it is desired to drive the pad to a low state ("−1"), all of the bottom transistors 216-218 can be on (conducting) based on a signal from the encoding circuitry 204 to pull the pad down quickly with all of the top transistors 211-213 being off. When the low level is reached, then two of the bottom transistors 217, 218 can turn off.

The receiving circuitry 202 reads the voltage at the far end of the channel and supplies the voltage level to receiving circuitry that includes a decoder for the data strobe signal and the inversion indicator.

In a high end (far end) grounded termination state (i.e., supply termination state), the memory circuit relies on the end transistor 221 to drive the appropriate channel line in the bus to a neutral or zero state, e.g., greater than VDDO/2. In an example embodiment, the low, ground-connected transistor 222 is on (i.e., conducting) at all times. The neutral voltage level need not be centered exactly at VDDO/2. The transistors 211-213, 216-218 can be in the off state. This high end grounded relies on the termination circuitry to pull the channel to the neutral state. The state of the transistors for the driver circuitry, the transition state of the strobe signal, and the receiver circuitry follows:

| Transition states for DQSP | | 211 Datp1 | 212 Datp2 | 213 Datp3 | 216 Datn1 | 217 Datn2 | 218 Datn3 | 221, Rodt |
|---|---|---|---|---|---|---|---|---|
| −1 | 0 | ON | OFF | ON | OFF | OFF | ON | ON |
| −1 | 1 | ON | ON | OFF | OFF | OFF | OFF | ON |
| 0 | −1 | OFF | OFF | OFF | ON | OFF | ON | ON |
| 0 | 0 | OFF | OFF | ON | OFF | OFF | ON | ON |
| 0 | 1 | ON | OFF | ON | OFF | OFF | OFF | ON |
| 1 | 0 | OFF | OFF | ON | ON | OFF | ON | ON |
| 1 | −1 | OFF | OFF | OFF | ON | ON | OFF | ON |

In a low grounded (far end) termination state (i.e., near ground termination state), the memory circuit relies on the transistors (e.g., in the pre-driver circuitry 204) to drive the appropriate channel line in the bus to a negative state (−1 state), e.g., less than VDDO/2. the memory circuit relies on the end transistor 221 to drive the appropriate channel line in the bus to a neutral or zero state, e.g., greater than VDDO/2. In an example embodiment, the high pull up transistor 221 is on (i.e., conducting) at all times. The resistors 224, 225 values may be different than the high termination or the center tap examples. The negative voltage level need not be at a negative value but can be less than half the VDDO value (e.g., less than VDDO/2). The ground connected transistors 211-213, or any combination thereof, can be conducting to connect the channel 107 to a voltage less than the zero value or less than VDDO/2. The state of the transistors for the driver circuitry, the transition state of the strobe signal, and the receiver circuitry for low grounded termination follows:

| Transition states for DQSP | | 211 Datp1 | 212 Datp2 | 213 Datp3 | 216 Datn1 | 217 Datn2 | 218 Datn3 | 222, Rodt |
|---|---|---|---|---|---|---|---|---|
| −1 | 0 | ON | OFF | ON | OFF | OFF | ON | ON |
| −1 | 1 | ON | ON | OFF | OFF | OFF | OFF | ON |
| 0 | −1 | OFF | OFF | OFF | ON | OFF | ON | ON |
| 0 | 0 | OFF | OFF | ON | OFF | OFF | ON | ON |
| 0 | 1 | ON | OFF | ON | OFF | OFF | OFF | ON |
| 1 | 0 | OFF | OFF | ON | ON | OFF | ON | ON |
| 1 | −1 | OFF | OFF | OFF | ON | ON | OFF | ON |

The center tap state can be where the latch is tapped from an intermediate location along the channel 107 after the driver side circuitry 2016 and before the receiver circuitry 202. In an example embodiment, the positive and negative resistors, Rodt 224 and Rodt 225 and Rn3 are used as dynamic impedances. The impedance values The impedance values can vary depending on frequency, load, on-die termination value and transistor swing values. The resistors 224, 225 values may be different than the high termination or the low termination examples. The state of the transistors for use in the center tap state including the driver circuitry, the transition state of the strobe signal and the receiver circuitry follows:

| Transition states for DQSP | | 211 Datp1 | 212 Datp2 | 213 Datp3 | 216 Datn1 | 217 Datn2 | 218 Datn3 | 221, 222, Rodt |
|---|---|---|---|---|---|---|---|---|
| −1 | 0 | ON | OFF | ON | OFF | OFF | ON | ON |
| −1 | 1 | ON | ON | OFF | OFF | OFF | OFF | ON |
| 0 | −1 | OFF | OFF | OFF | ON | OFF | ON | ON |
| 0 | 0 | OFF | OFF | OFF | OFF | OFF | OFF | ON |
| 0 | 1 | ON | OFF | ON | OFF | OFF | OFF | ON |
| 1 | 0 | OFF | OFF | ON | ON | OFF | ON | ON |
| 1 | −1 | OFF | OFF | OFF | ON | ON | OFF | ON |

In each of the above examples, the signal DQNP will move in the opposite direction, e.g., value, as the signal at DQSP to maintain the differential signal representing the strobe signal.

Figure 3:
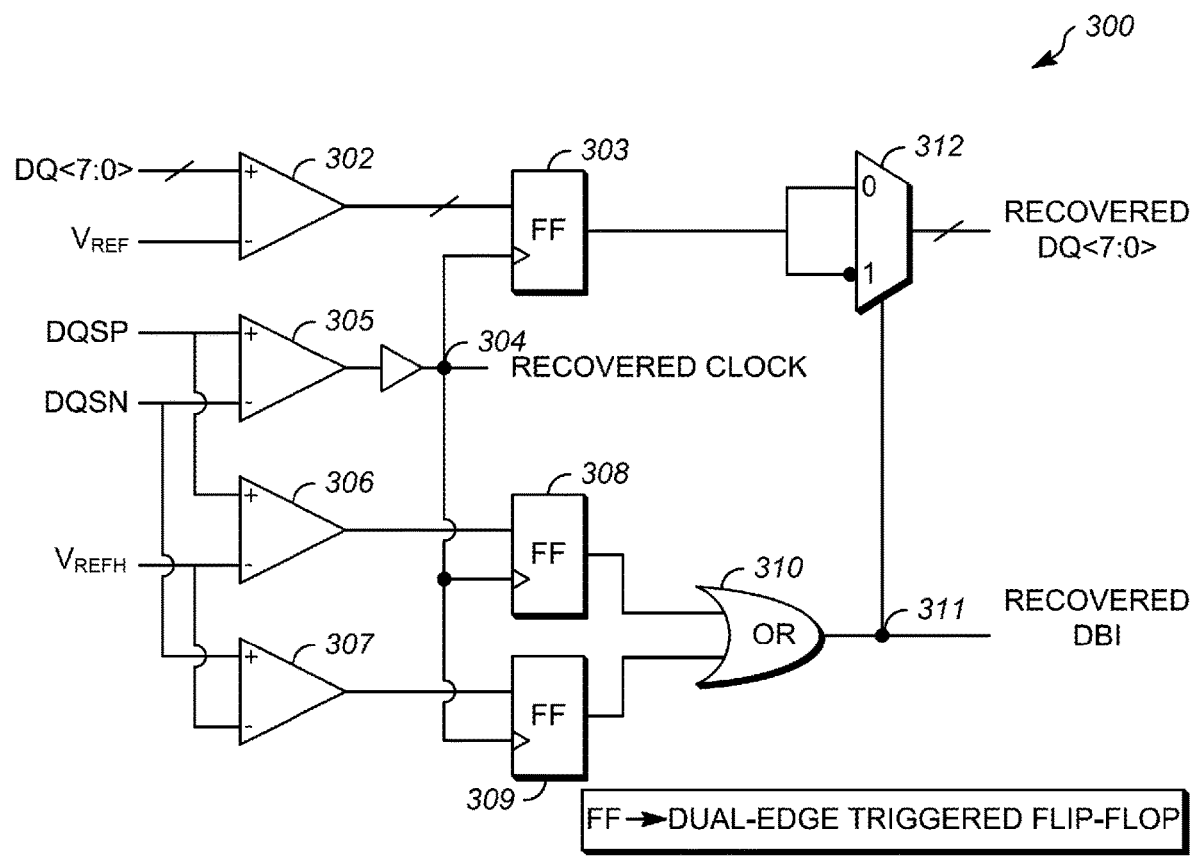
FIG. 3 shows a receiver to receive data over a bus including data inversion signaling over the strobe according to an aspect of the present disclosure.

FIG. 3 illustrates an example of a receiver 300 to received signals over the channel. The channel supplies the data DQ0-DQ7 and the data strobe signal DQS, here shown as a differential signal DQSP, DQSN. The receiver 300 include a data comparator 302 for each data line in the data channel. The data comparator compares the data signal received from the data channels D0-D7 to a reference voltage and output a low signal "0" or a high signal "1." The output is fed to a dual-edge triggered flipflop 303, which is controlled by the recovered clock signal 304. The recovered clock signal 304 is generated by the differential signal from the data strobe signals, DQSP, DQSN. The data strobe signals, DQSP, DQSN, are fed to a comparator 305 which outputs the recovered clock signal. The data strobe signals, DQSP, DQSN are also fed to comparators 306, 307, respectively to determine the common mode voltage level in the data strobe signal. A reference high voltage is fed to an input of the comparators 306, 307. Output from the comparators 306, 307 are captured in dual-edge triggered flip-flops 308, 309. A logical or gate 310 receives output from the flip-flops, which are controlled by the recovered clock 304. An inverter 312 receives the data from the flip-flop 303 and based on a state of the inversion indicator 311 can either pass the data set without inversion or invert the data.

Figure 4:
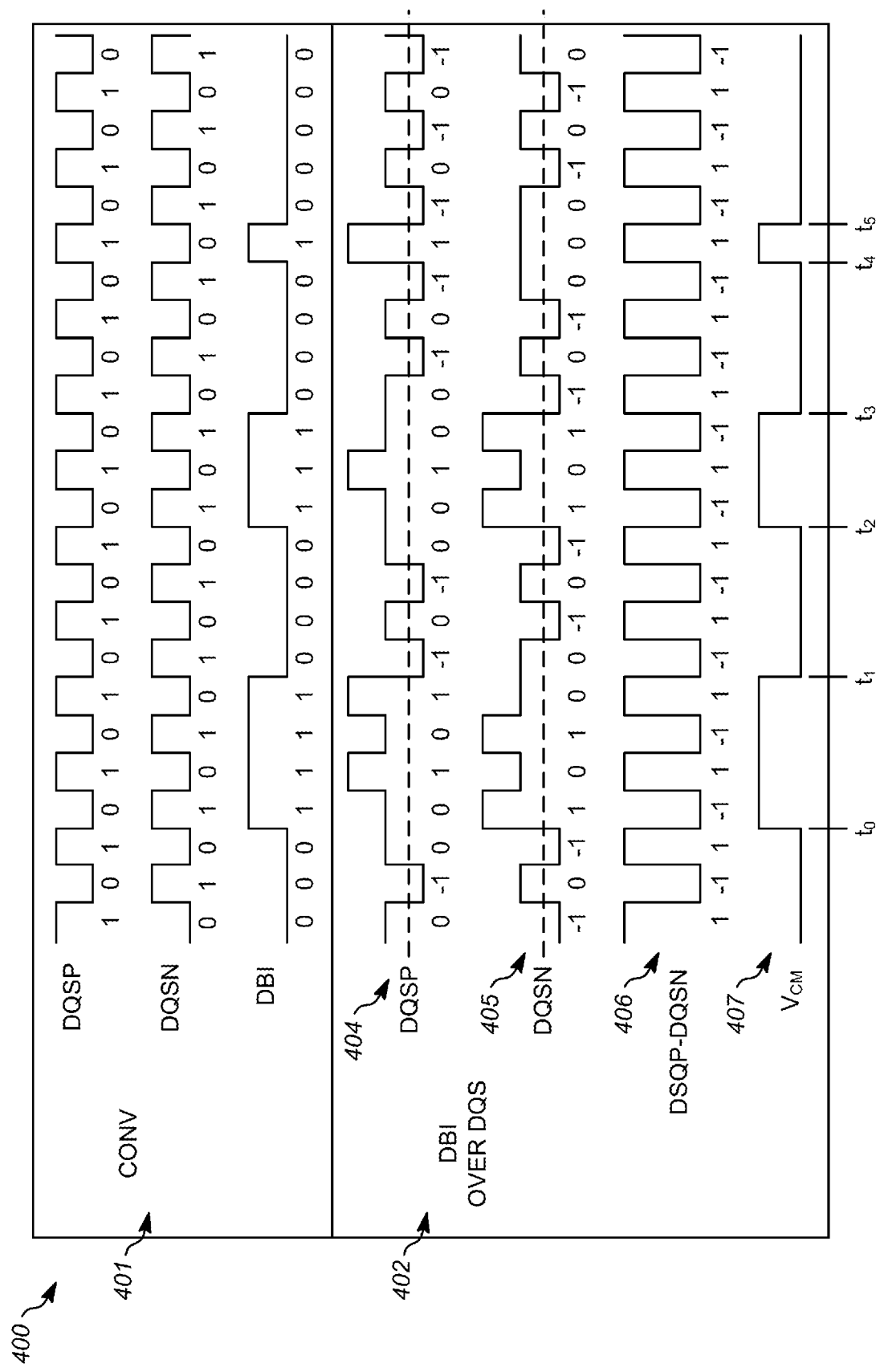
FIG. 4 shows a timing diagram for operating a nonvolatile memory according to an aspect of the present disclosure.

FIG. 4 illustrates a timing diagram 400 according to an example embodiment that shows a conventional signaling 401 and signaling according to the present disclosure 402.

DQSP, DQSN and data inversion DBI are each send along separate communication channels. DQSP and DQSN transition at the same point to set the clock signal at the receiver. The DBI signal movers from a low signal state to a high signal state when the data is inverted.

The signaling 402 shows signaling to have the inversion indicator 407 encoded with the differential data strobe signals 404, 405. The clock signal 406 is determined based on the differential between signal 404, 405. At time period $t_0$-$t_1$, both signals 404, 405 are shifted upward to a higher voltage while maintaining the differential difference therebetween. The differential difference encodes the clock. The level shift will indicate a common mode voltage that is the inversion indicator. The data strobe signal on the channel includes both the clock and the inversion indicator at the same time. The level shift also is shown as occurring between time periods $t_2$-$t_3$, and $t_4$-$t_5$.

Figure 5:
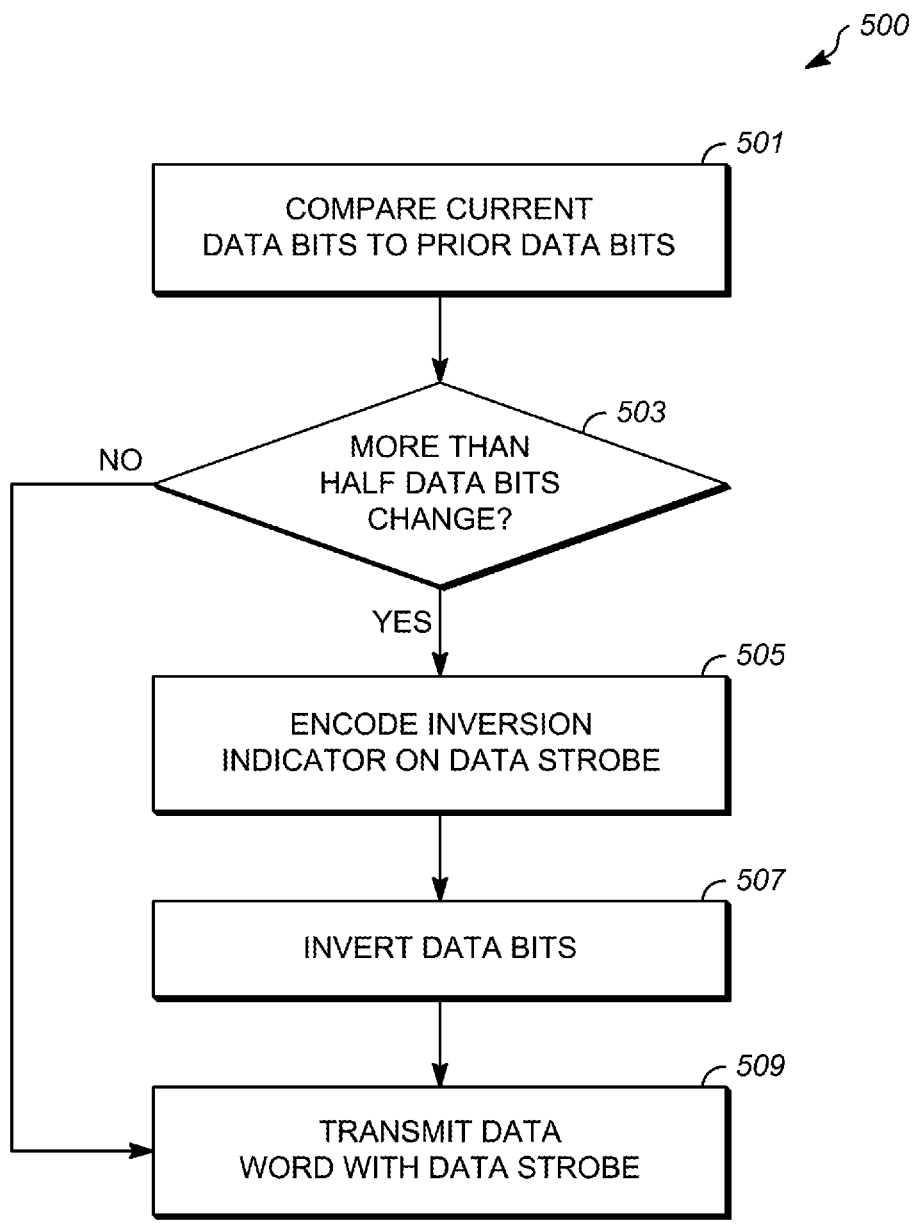
FIG. 5 shows a process according to an aspect of the present disclosure.

FIG. 5 illustrates a process 500 for encoding the data inversion indicator. At 501, the current data bits are compared to the prior data bits. At 503, it is determined if more than half the data bits change. If less than half or half the number of data bits in the data set, then the process moves to operation 509. If more than half of the data bots change, then the inversion indicator is set. At 505, the inversion indicator is encoded on the data strobe signal. At 507, the bits in the data set are inverted. At 509, the data set is transmitted with the data strobe signal that is encoded with the inversion indicator. The data strobe signal maintains the clock signal.

In an example embodiment, data bits in the data set are so received by compare logic. The compare logic either compares the current data bits with the previous data bits, which can be both stored in latches or data storage. The logic can calculate the majority of the data bits which toggle high or low. The compare logic can determine whether more than half of the data bits have changed state, or toggled, as compared to their previous values, and if more than half of the data bits DQ have changed state, then the compare logic outputs a data inversion signal.

The logic circuit can determine whether the majority of the data bits will toggle low or high, and if more than half of the data bits will toggle low for a terminated-high bus or toggle high for a terminated-low bus, then the compare logic outputs a data inversion signal.

Figure 6:
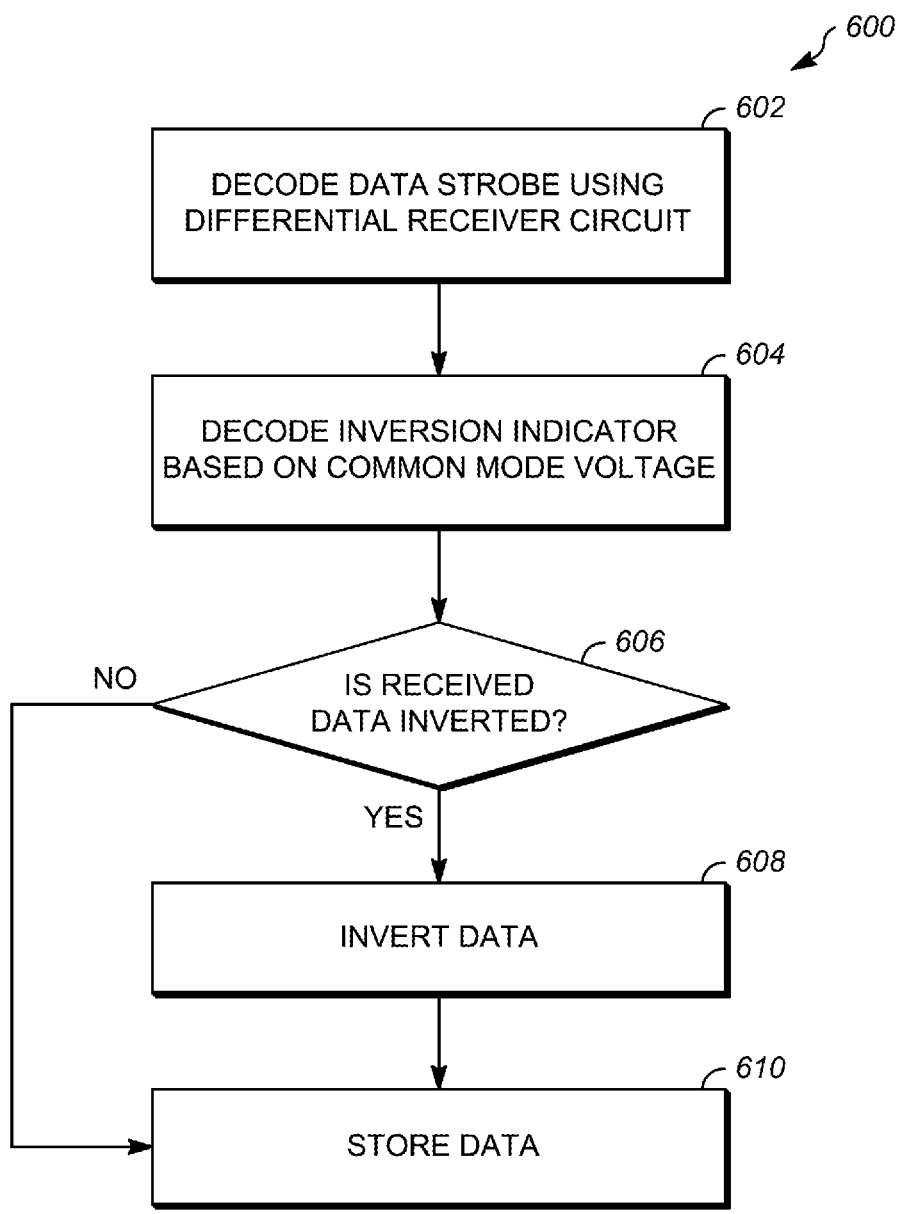
FIG. 6 shows a process according to an aspect of the present disclosure.

FIG. 6 illustrates a process 600 for decoding the data inversion indicator. At 602, the data strobe signal is decoded using a differential receiver circuit to set the clock signal. At 604, the signal level of the data strobe signal is determined based on the common mode voltage of the data strobe signal. If the common mode voltage of the strobe signal is greater than a reference voltage, then the inversion indicator is set to inversion. At 606, it is determined if the inversion indicator is set. If the inversion indicator is not set, then the data set can be stored without inversion at 610. If the inversion indicator is set, the data set is inverted at 608. At 610, the data set is stored.

Figure 7:
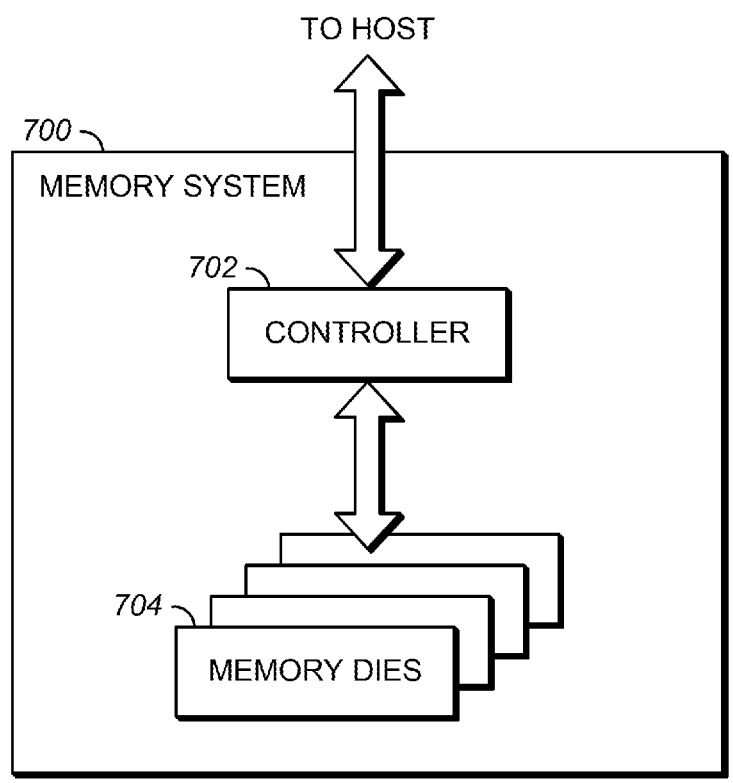
FIG. 7 generally illustrates a block diagram of an example memory system according to an aspect of the present disclosure.

FIG. 7 generally illustrates a block diagram illustrating a memory system 700. The memory system 700 may include a controller 702 and memory that may include or be made up of one or more memory dies 704. As used herein, the term die refers to the set of memory cells, and associated circuitry for managing the physical operation of those memory cells, that are formed on a single semiconductor substrate. The controller 702 may interface with a host system and transmit command sequences for read, program, and erase operations to the non-memory die(s) 704.

The controller 702 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 702 can be configured with hardware and/or firmware to perform the various functions described herein and generally illustrated in the timing diagrams. For example, the controller can control the erase verify signal levels and the soft erase signal levels on the odd and even wordlines in the non-volatile memory. Additionally, or alternatively, some of the components shown as being internal to the controller can also be stored external to the controller, and other components can be used. Additionally, or alternatively, the phrase "operatively in communication with" could mean directly in communication with or indirectly (wired or wireless) in communication with through one or more components, which may or may not be generally illustrated or described herein.

As used herein, the controller 702 is a device that manages data stored in the memory die(s) and communicates with a host, such as a computer or electronic device. The controller 702 can have various functionality in addition to the specific functionality described herein. For example, the controller 702 can format the memory dies 704 to ensure the memory dies 704 are operating properly, map out bad flash memory cells (e.g., by using the erase verify operations as described herein), and allocate spare cells to be substituted for future failed cells. Some part of the spare cells can be used to hold firmware to operate the controller 702 and implement other features. In operation, when a host needs to read data from or write data to the memory die(s) 704, the host will communicate with the controller 702. If the host provides a logical address to which data is to be read/written, the controller 702 can convert the logical address received from the host to a physical address in the memory die(s) 704. (Alternatively, the host can provide the physical address). The controller 702 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). The controller 702 can also control the erase verify operation as described herein. The memory die 704 includes the inhibit bit lines and the program bit lines as described herein.

The interface between the controller 702 and the non-volatile memory die(s) 704 may be any suitable interface, such as flash interface, including those configured for Toggle Mode 200, 400, 800, 1000 or higher. For some example embodiments, the memory system 700 may be a card-based system, such as a secure digital (SD) or a micro secure digital (micro-SD) card. In alternate example embodiments, the memory system 700 may be part of an embedded memory system.

In the example illustrated in FIG. 7, the memory system 700 is generally illustrated as including a single channel between the controller 702 and the non-volatile memory die(s) 704. However, the subject matter described herein is not limited to memory systems having a single memory channel. For example, in some memory systems, such as those embodying NAND architectures, 2, 4, 8 or more channels may exist between the controller 702 and the memory die(s) 704, depending on controller capabilities. In any of the embodiments described herein, more than a single channel may exist between the controller and the memory die(s) 704, even if a single channel is shown in the drawings.

Figure 8:
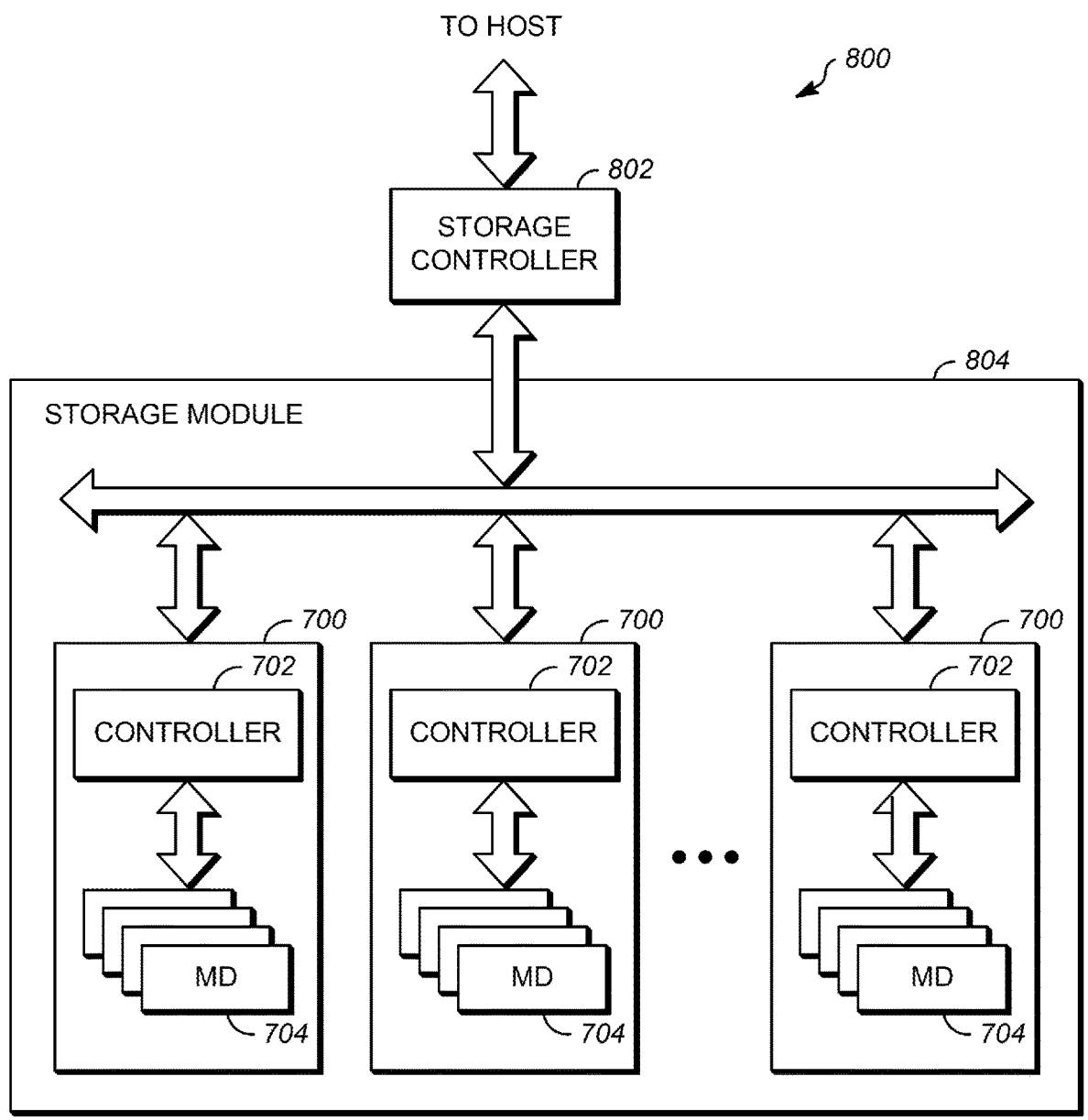
FIG. 8 generally illustrates a block diagram of an example storage module that includes a plurality of memory systems according to an aspect of the present disclosure.

FIG. 8 illustrates a storage module 800 that includes a plurality of non-volatile memory systems 700. As such, the storage module 800 may include a storage controller 802 that interfaces with a host and with a storage system 804, which includes a plurality of non-volatile memory systems 700. The interface between the storage controller 802 and non-volatile memory systems 400 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples. The storage module 800, in one embodiment, may be a solid-state drive (SSD), such as found in portable computing devices, such as laptop computers and tablet computers, and mobile phones.

Figure 9:
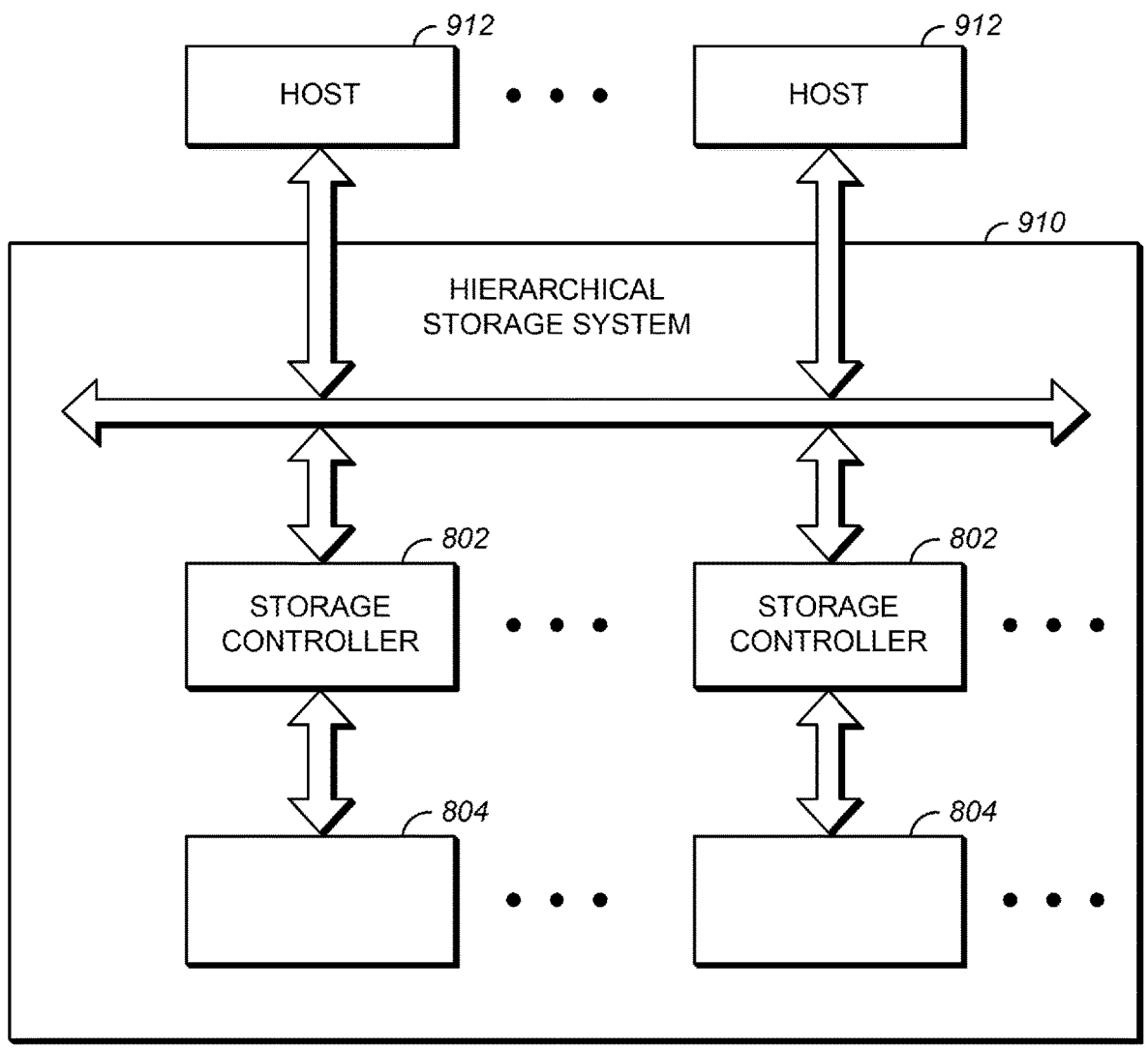
FIG. 9 generally illustrates a block diagram of an example hierarchical storage system.

FIG. 9 is a block diagram illustrating a hierarchical storage system 910. The hierarchical storage system 910 may include a plurality of storage controllers 802, each of which control a respective storage system 804. Host systems 912 may access memories within the hierarchical storage system 910 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 910 illustrated in FIG. 9 may be a rack mountable mass storage system that is accessible by multiple host computers, such as would be found in a data center or other location where mass storage is needed.

The memory system as described herein may include a memory cell structure that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon. A plurality of memory cells arranged in two dimensions is referred to as a two-dimensional (2-D) memory cell structure. A plurality of memory cells arranged in three dimensions is referred to as a three-dimensional (3-D) memory cell structure. In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate. As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three-dimensional memory array.

Additionally, or alternatively, the memory cells of a block or of the memory cell structure generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include two, three, or four, although MLC cells that store more than 4 bits may be possible. In general, certain collections of memory cells are configured to store the same number of bits. For example, memory cells that are part of the same word line cell group, part of the same block, or part of the same memory cell structure, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

The memory cells store data by being configured in memory states in NAND. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, the memory as described herein may include a power control circuit that is configured to generate and supply control line voltages (including voltage pulses) to control lines of the memory cell structures. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit also be configured to generate and/or supply voltages other than the control lines voltages, including other voltages that may be supplied to the memory cell structure, the read/write circuits, the sense blocks, and/or other circuit components on the memory die.

The memory devices that use the presently described systems and methodologies can provide an improved transmission rate with lower power consumption, e.g., as the number of the bots that require greater power to read or transmit can be reduced. In an example embodiment. the DQSP/DQSN signals of transmission link, the transmitter and receiver can use less power. The common mode of DQS changes to indicate whether the data bits are inverted or not.

The presently described systems and methods that use the clock signal, e.g., DQS in the transmission link, to indicate data bit inversion, e.g., DBI, may provide a power savings by reducing the use of the data bits in transmission, encoding or decoding which require more power. In an example, the use of the more power efficient data bits can result in a power savings of over 10%, over 20% or 27% or more. The die or physical memory structure does not require the addition of an additional inversion signaling line when the clock signal is used to provide timing and indicate data inversion. This saves the cost in real estate and power of additional high speed communication channel. The presently methods and systems makes feasible to implement and save power even in small form factor memory products, e.g., iNAND and RPG. The present systems and methods may lower the need of an on-die-capacitor as the impact of SSN is reduced (due to limited transition activity).

In various embodiments described herein, systems and methods to reduce power-to-performance ratio when using a Toggle Mode (TM) in non-volatile memory, without having to add any additional high-speed channel. As described herein, encode Data Bus Invert (DBI) information is encoded in a strobe (e.g., DQSP/DQSN) signal, which is also transferred along with data bits (D0-D7). It is noted that Data Bus Inversion (DBI) is an I/O signaling technique that aims to reduce DC power consumption by selectively inverting the data bus for systems where the power consumed between alternate signaled states is asymmetric. Encoding DBI over strobe signal is achieved by shifting common-mode voltage of DQSP/DQSN signal. Strobe information is preserved for clock recovery and is recovered by a fully differential receiver.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. A non-volatile memory method, comprising:
   encoding data bits in a data set to be transmitted on a data bus in a non-volatile memory device, wherein encoding includes not inverting the data bits based on a first data state and inverting the data bits based on a second data state;
   encoding a data strobe signal to include an inversion indicator of a non-inversion state or an inversion state of the data set within the strobe signal;
   transmitting the data set; and
   decoding the data set using the data strobe signal.

2. The method of claim 1, wherein encoding a data strobe signal includes maintaining clock continuity with the inversion indicator while simultaneously transmitting both the data strobe signal and the inversion indictor on a single channel.

3. The method of claim 1, wherein encoding the data strobe signal includes encoding a data strobe positive signal and a data strobe negative signal.

4. The method of claim 3, wherein encoding the data strobe signal includes shifting the common mode voltage level of both the data strobe positive signal and the data strobe negative signal from a base level to set the inversion indicator to indicate that the data set is inverted.

5. The method of claim 4, wherein encoding the data strobe signal includes maintain the differential between the data strobe positive signal and the data strobe negative signal to set the data strobe.

6. The method of claim 5, wherein decoding includes comparing the data strobe positive signal and the data strobe negative signal to each other to recover a clock signal and comparing the data strobe positive signal and the data strobe negative signal to a voltage reference to recover the inversion indicator from the data strobe signal.

7. The method of claim 6, wherein the recovered clock signal controls operation of a dual edge triggered flip-flop to forwarding of the data set and determining the inversion indicator that controls whether to invert the data set.

8. A method comprising:
  determining whether to invert a data set on a data channel, including considering whether less power will be used if the data bus is inverted, a percentage of data bits that will change state as compared to respective previous values, and whether a majority of data bits will toggle high-to-low or low-to-high depending on the data channel;
  based on a determination to invert the data set, encoding a data inversion indictor in the data strobe signal with a data strobe and data inversion indictor being transmitted at the same time on the data strobe channel;
  receiving the inversion indicator and data strobe at an end of the channel;
  decoding the inversion indicator to determine whether the data set is inverted and the data strobe from the data strobe channel; and
  interpreting the received data set using the decoded inversion indictor and the decoded data strobe signal.

9. The method of claim 8, wherein determining whether to invert the data bus comprises determining to invert the data set if more than half of a number of data bits in the data set will change state.

10. The method of claim 8, wherein the data channel comprises a terminated-high bus, and wherein determining whether to invert the data set received at a terminal end of the terminated-high bus comprises determining whether more than half of the number of data bits in the data set will change state from a high logic state to a low logic state.

11. The method of claim 8, wherein the data channel comprises a terminated-low bus, and wherein determining whether to invert the data set received at a terminal end of the terminated-low bus comprises determining whether more than half of a number of data bits in the data set will change state from a low logic state to a high logic state.

12. The method of claim 8, wherein encoding data inversion indictor in the data strobe signal includes maintaining clock continuity with the data inversion indicator while simultaneously transmitting both the data strobe signal and the data inversion indictor in a data strobe communication.

13. A NAND memory, comprising:
  a transmitter to:
    encode data bits in a data set to be transmitted on a data bus in the NAND memory, wherein encoding includes not inverting the data bits based on a first data state and inverting the data bits based on a second data state;
    encode a data strobe signal to include an inversion indicator of a non-inversion state or an inversion state of the data set within the data strobe signal that communicates a clock; and
    transmitting the data set;
  a data bus receiving the data set from the transmitter; and
  a receiver to:
    receive the data set and the data strobe signal and decode both the clock and the inversion indicator from the data strobe signal.

14. The memory of claim 13, wherein the receiver is configured to decode a common mode voltage from a differential data strobe signal to determine the inversion indicator.

15. The memory of claim 14, wherein the receiver is configured to determine phase and frequency of the data set from the differential of a data strobe positive signal and a data strobe negative signal.

16. The memory of claim 13, wherein the receiver includes a comparator to compare both a data strobe positive signal and a data strobe negative signal to a reference voltage to determine the inversion indicator.

17. The memory of claim 16, wherein the receiver sets the inversion indictor to invert the data set when the common mode voltage exceeds the reference voltage.

18. The memory of claim 17, wherein the reference voltage is greater than 0.6*VDDO.

19. The memory of claim 16, wherein the receiver includes:
  a comparator to determine the clock and a plurality of dual-edge triggered flip flops to capture the data set and the inversion indicator, and
  an inversion circuit to invert the data set when the inversion indicator indicates that the data set is inverted.

20. The memory of claim 13, wherein the data bus is center tapped with the data being read before a termination end of the data bus.

* * * * *